United States Patent
Sadana et al.

(10) Patent No.: US 12,205,936 B2
(45) Date of Patent: Jan. 21, 2025

(54) SILICON ON SAPPHIRE SUBSTRATE FOR EDGE COMPUTER

(71) Applicant: INTERNATIONAL BUSINESS MACHINES CORPORATION, Armonk, NY (US)

(72) Inventors: Devendra K Sadana, Pleasantville, NY (US); Ning Li, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 625 days.

(21) Appl. No.: 17/477,520

(22) Filed: Sep. 16, 2021

(65) Prior Publication Data

US 2023/0080397 A1   Mar. 16, 2023

(51) Int. Cl.
| | | |
|---|---|---|
| *H01L 27/15* | (2006.01) | |
| *H01L 23/66* | (2006.01) | |
| *H01L 25/16* | (2023.01) | |
| *H01L 29/16* | (2006.01) | |
| *H01L 31/12* | (2006.01) | |
| *H01L 33/00* | (2010.01) | |

(52) U.S. Cl.
CPC ............ *H01L 25/167* (2013.01); *H01L 23/66* (2013.01); *H01L 2223/6677* (2013.01); *H02J 2300/24* (2020.01); *H03J 2200/06* (2013.01)

(58) Field of Classification Search
CPC .................. H01L 25/167; H01L 23/66; H01L 2223/6677; H01Q 1/2283; H01Q 1/38
See application file for complete search history.

(56) References Cited

U.S. PATENT DOCUMENTS

| | | | |
|---|---|---|---|
| 3,584,183 A | | 6/1971 | Chiaretta et al. |
| 4,393,578 A | | 7/1983 | Cady et al. |
| 4,735,917 A | | 4/1988 | Flatley et al. |
| 5,495,260 A | * | 2/1996 | Couture ................ H01Q 9/285 343/702 |
| 5,895,957 A | | 4/1999 | Reedy et al. |
| 6,720,830 B2 | | 4/2004 | Andreou et al. |
| 7,831,152 B2 | | 11/2010 | Tatum et al. |
| 9,225,056 B2 | | 12/2015 | Pope et al. |
| 10,374,120 B2 | | 8/2019 | Atwater, Jr. et al. |
| 2017/0271279 A1 | * | 9/2017 | Du .......................... H02S 20/00 |
| 2019/0058091 A1 | * | 2/2019 | Kim ........................ H01L 33/32 |
| 2019/0064431 A1 | * | 2/2019 | Keranen et al. ...... G02B 6/0065 |
| 2020/0185581 A1 | * | 6/2020 | Liu ...................... H01L 25/0753 |

(Continued)

OTHER PUBLICATIONS

Okuyama et al., "Wireless Inter-Chip Signal Transmission by Electromagnetic Coupling of Open-Ring Resonators," Extended Abstracts of the 2008 International Conference on Solid State Devices and Materials, Tsukuba, 2008, pp. 394-395.

(Continued)

*Primary Examiner* — Ismail A Muse
(74) *Attorney, Agent, or Firm* — Jeffrey M. Ingalls

(57) ABSTRACT

A computing device is provided. The computing device includes a sapphire substrate having a first surface and a second surface opposed to the first surface, a light receiving device having a first surface and a second surface opposed to the first surface, the second surface of the light receiving device coupled to the first surface of the sapphire substrate, a memory coupled to the first surface of the light receiving device, and an antenna coupled to the first surface of the sapphire substrate.

20 Claims, 4 Drawing Sheets

(56) References Cited

U.S. PATENT DOCUMENTS

2021/0267498 A1* 9/2021 Burnes ............... A61B 5/14735
2022/0069154 A1* 3/2022 Bower ..................... G02B 6/10
2022/0352213 A1* 11/2022 Guo ................... H01L 27/1222

OTHER PUBLICATIONS

Marwick et al., "A UV photodetector with internal gain fabricated in silicon on sapphire CMOS," Sensors, 2007, pp. 535-538.

* cited by examiner

SILICON ON SAPPHIRE SUBSTRATE FOR EDGE COMPUTER

BACKGROUND

The present disclosure relates to the electrical, electronic and computer arts and, more particularly, to the formation of silicon on sapphire (SOS) substrate structures and related devices for edge computing devices. In general, an edge computing device refers to a distributed computing framework that brings enterprise applications closer to data sources such as Internet of Things (IoT) devices or local edge servers. Edge devices (or edge computing devices) may be many different types of devices, such as an IoT sensor, a notebook computer, a smartphone, a security camera or even an internet-connected microwave oven. Certain edge computing devices may be smaller in scale and may include input sensors, such as a photovoltaic cell that receives light. Certain edge computing devices may also include output devices such as a light emitting diode (LED). Edge computing devices are becoming smaller in scale, and thus optimizing the footprint of such devices becomes a topic of interest.

SUMMARY

Embodiments of the present disclosure relate to a computing device. The computing device includes a sapphire substrate having a first surface and a second surface opposed to the first surface, a light receiving device having a first surface and a second surface opposed to the first surface, the second surface of the light receiving device coupled to the first surface of the sapphire substrate, a memory coupled to the first surface of the light receiving device, and an antenna coupled to the first surface of the sapphire substrate.

Other embodiments relate to a computing device. The computing device includes a sapphire substrate having a first surface and a second surface opposed to the first surface; a light receiving device having a first surface and a second surface opposed to the first surface, the second surface of the light receiving device coupled to the first surface of the sapphire substrate; a memory coupled to the first surface of the light receiving device; and an antenna coupled to the second surface of the sapphire substrate.

Other embodiments relate to a computing device. The computing device includes a sapphire substrate having a first surface and a second surface opposed to the first surface; a light receiving device having a first surface and a second surface opposed to the first surface, the second surface of the light receiving device coupled to the first surface of the sapphire substrate; a memory coupled to the first surface of the light receiving device; and a light-emitting device connected to the light receiving device.

The above summary is not intended to describe each illustrated embodiment or every implementation of the present disclosure.

BRIEF DESCRIPTION OF THE DRAWINGS

The drawings included in the present application are incorporated into, and form part of the specification. They illustrate embodiments of the present disclosure and, along with the description, explain the principles of the disclosure. The drawings are only illustrative of certain embodiments and do not limit the disclosure.

DETAILED DESCRIPTION

Figure 1:
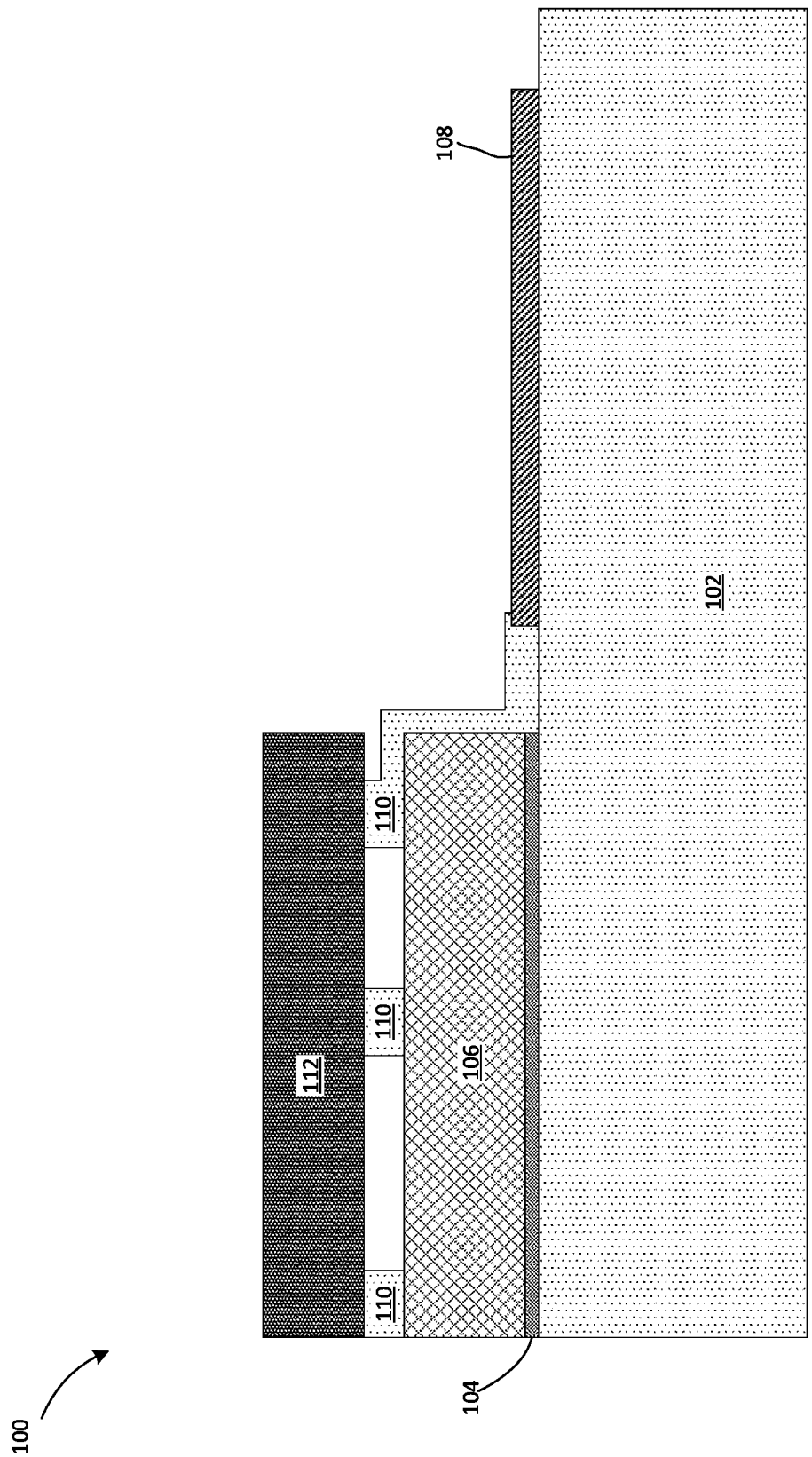
FIG. 1 is a cross-sectional view of edge computing device with a sapphire substrate, according to embodiments.

As mentioned above, the present disclosure relates to edge computing devices which include a silicon on sapphire (SOS) substrate with various components formed thereon. As edge computing devices become smaller in scale, optimizing the footprint of such devices becomes a topic of interest. In certain edge computing devices, a silicon carrier substrate may be utilized in combination with one or more input/output (I/O) devices, one or more memory devices, and/or one or more processors. In certain edge computing devices that utilize a silicon (Si) carrier substrate, multiple bonding steps may be required to attach the components (e.g., optical power components such as a photovoltaic cell, and communication components such as a light-emitting diode (LED)) to the substrate, and due to the non-transparent nature of the substrate all of the components may need to be mounted on one side of the Si substrate.

However, according to various embodiments of the present disclosure, a sapphire substrate may be used for a small edge computing device. In certain embodiments, the sapphire substrate is transparent (or at least partially transparent), which may allow for input and output devices to send or receive photons from both sides of the sapphire substrate. This may allow for a reduction in size (i.e., the footprint) of the edge computing device. This may also allow for a reduction in the number of bonding steps that are needed to mount the various components of the edge computing device onto the sapphire substrate.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit ("IC") fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping, and patterning/lithography.

Deposition is any process that grows, coats, or otherwise transfers a material onto the wafer. Available technologies include physical vapor deposition ("PVD"), chemical vapor deposition ("CVD"), electrochemical deposition ("ECD"), molecular beam epitaxy ("MBE") and more recently, atomic layer deposition ("ALD") among others. Another deposition technology is plasma-enhanced chemical vapor deposition ("PECVD"), which is a process that uses the energy within the plasma to induce reactions at the wafer surface that would otherwise require higher temperatures associated with conventional CVD. Energetic ion bombardment during PECVD deposition can also improve the film's electrical and mechanical properties.

Removal/etching is any process that removes material from the wafer. Examples include etching processes (either wet or dry), chemical-mechanical planarization ("CMP"), and the like. One example of a removal process is ion beam etching ("IBE"). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching ("RIE"). In general, RIE uses chemically reactive plasma to remove material deposited on wafers. With RIE the plasma is generated under low pressure (vacuum) by an electromagnetic field. High-energy ions from the RIE plasma attack the wafer surface and react with it to remove material.

Semiconductor doping is the modification of electrical properties by doping, for example, transistor sources and drains, generally by diffusion and/or by ion implantation. These doping processes are followed by furnace annealing or by rapid thermal annealing ("RTA"). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light-sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of memory technologies that are more specifically relevant to aspects of the present disclosure, edge computing devices (or small edge computing devices) may include one or more components mounted thereon (or bonded thereto). The components of the edge computing device may include one or more of an input device (e.g., a light receiving device or a radio frequency antenna), an output device (e.g., a light emitting device), a memory device, a battery, and a processor, etc.

As the concept of the Internet of Things (IoT) grows and electronic devices (e.g., edge computing devices) become smaller and more self-contained, smaller power sources are needed. Additionally, certain types of IoT devices need some type of small data receiver. Some IoT devices, such as those fabricated as semiconductor devices, may have a total overall area footprint as small as 100 µm×100 µm. Each device requires a power source to operate and may be embedded into very small objects. Thus, IoT devices having a self-contained power source may be highly desirable. Photovoltaic cells provide a small voltage and recharge when exposed to light. Thus, one type of input component for an edge computing device may be a photovoltaic cell. As many IoT devices need both a power source and a data receiver, a combination of a photovoltaic cell and a photodetector may be provided. The photovoltaic cell(s) provides the power source, and the photodetector may be used as a data receiver. In certain examples, the photovoltaic cell may be a silicon based device.

One type of an output device that may be included on an IoT device is a light-emitting device (LED). In general, an LED is a semiconductor light source that emits light when current flows through it. Electrons in the semiconductor recombine with electron holes, releasing energy in the form of photons. The color of the light (corresponding to the energy of the photons) is determined by the energy required for electrons to cross the band gap of the semiconductor. White light is obtained by using multiple semiconductors or a layer of light-emitting phosphor on the semiconductor device. In certain examples, the power generated by the photovoltaic cell(s) on the edge computing device may be used to power the LED. It should be appreciated that any suitable type of LED may be used, such as a GaAs based LED, a GaN based LED, or an InGaAs based LED.

As mentioned above, the IoT device (or small edge computing device) may also include one or more memory elements. Any suitable type of memory may be used, such as random access memory (RAM), read only memory (ROM), a nonvolatile RAM (NVRAM) device, and magnetoresistive random-access memory (MRAM), etc. Examples of non-volatile memory are flash memory and ROM, PROM, EPROM and EEPROM memory. Examples of volatile memory are primary storage, which is typically dynamic random-access memory (DRAM), and fast CPU cache memory, which is typically static random-access memory (SRAM). One or more memory devices may be included on the small edge computing device, and they may be powered by, for example, the photovoltaic cell(s).

Referring now to the drawings in which like numerals represent the same or similar elements and initially to FIG. 1, an exemplary small edge computing device 100 is shown. The edge computing device 100 includes a sapphire substrate 102. The sapphire substrate 102 may be transparent or at least partially transparent to allow to be transferred from through the substrate from one side to the other. The transparent nature of the sapphire substrate 102 may have an effect that certain components of the edge computing device 100 that either receive light or transmit light can be mounted on either side of the substrate and still function. For example, a light receiving element or a light emitting element may be mounted on the top side of the sapphire substrate and receive or emit light through the back side. The ability to transmit light through the substrate is not possible with related types of edge computing devices that include a silicon based substrate that is opaque. According to certain embodiments described herein, the transparent nature of the sapphire substrate 102 may also allow for two components of the edge computing device 100 to be mounted on top of each other, where a first one of the components emits or receives light from a first direction (i.e., not through the substrate) and a second one of the components emits or receives light from a second direction (i.e., through the substrate). This stacking of components in a vertical direction relative to the sapphire substrate 102 may allow for a reduction in the overall size (i.e., the footprint) of the small edge computing device 100.

As shown in FIG. 1, the sapphire substrate 102 functions as a carrier substrate upon which one or more components of the edge computing device 100 are mounted. Another feature of the sapphire substrate 102 is that the material of the substrate has a high resistivity. This high resistivity of the sapphire substrate 102 may reduce or prevent a capacitive coupling between a component of the edge computing device 100 (e.g., the RD antenna 108) and the substrate itself.

As shown in FIG. 1, in certain embodiments, a radio frequency (RF) antenna 108 is mounted on a top side of the substrate 102. The RF antenna 108 may operate in a frequency range of gigahertz or tens of gigahertz. It should be appreciated that any suitable type of RF antenna may be used. In certain embodiments, a photovoltaic (PV) cell 106 is formed on the sapphire substrate 102. A thin layer of silicon 104 (or silicon layer) may be provided between the PV cell 106 and the sapphire substrate 102 in certain examples. In the embodiment shown in FIG. 1, a memory 112 is provided on top of the PV cell 106. The memory 112 may be bonded (i.e., electrically and physically connected) to the PV cell 106 and the RF antenna 108 with bonds 110. Thus, because the sapphire substrate 102 is transparent, the PV cell 106 can receive light from the backside (the underside or bottom as shown in FIG. 1) of the edge computing device 100 rather than from the topside. Because it is not required for the PV cell 106 to receive light from the topside, the memory 112 can be mounted directly on top of the PV cell 106, thus reducing the total footprint of the edge computing device 100.

Figure 2:
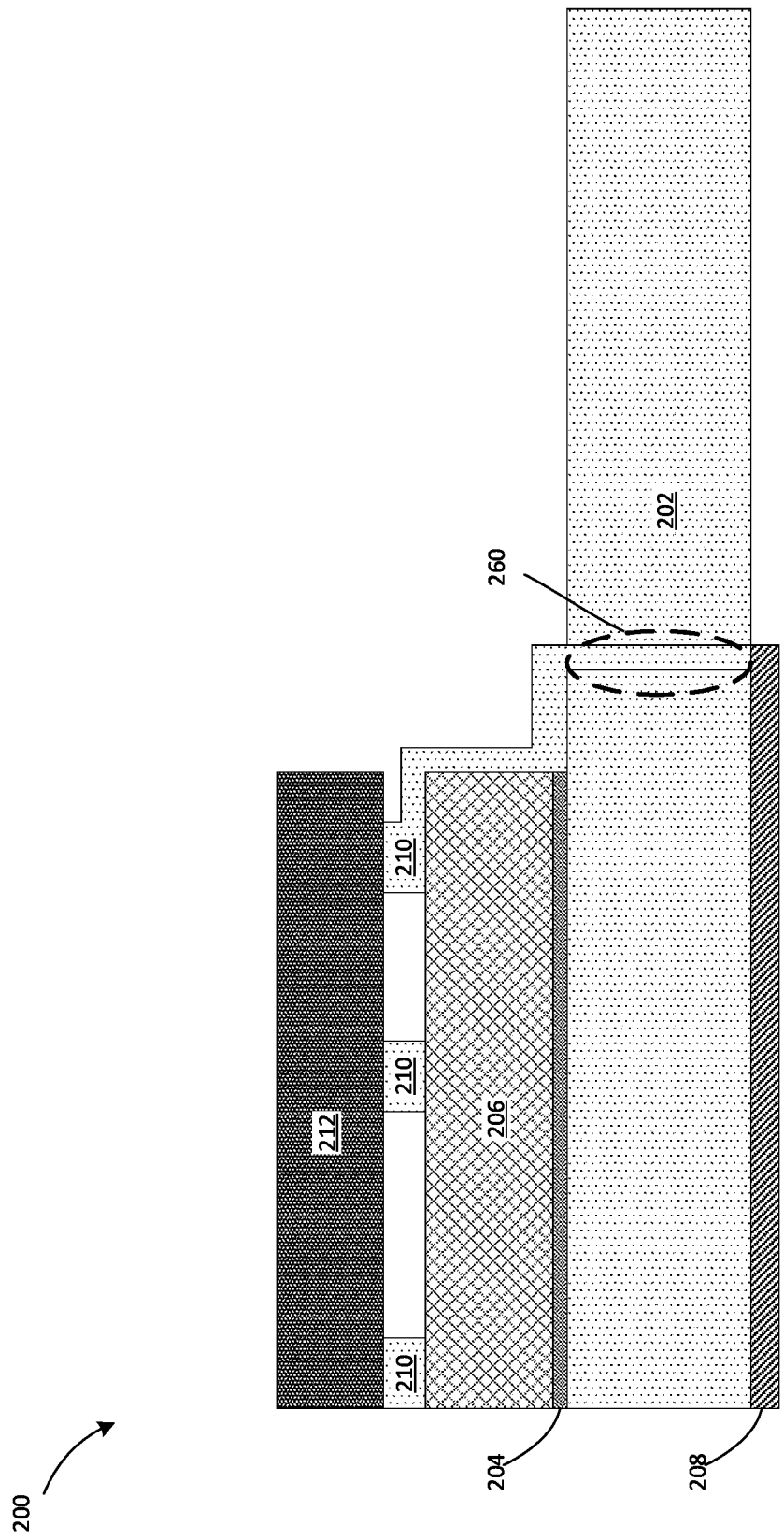
FIG. 2 is a cross-sectional view of edge computing device with a sapphire substrate, according to embodiments.

Referring now to FIG. 2, this figure shows a cross-sectional view of an edge computing device 200, according to embodiments. As shown in FIG. 2, a sapphire substrate 202 is provided, and may be similar to, or the same as, the sapphire substrate 202 described above with respect to FIG. 1. Similar to the embodiment shown in FIG. 1, a PV cell 206 is provided on the sapphire substrate 202 (with the thin layer of silicon 204 (or silicon layer) provided therebetween), and a memory 212 is provided on top of the PV cell 206. However, as shown in FIG. 2, in certain embodiments, the RF antenna 208 is provided on the bottom side of the sapphire substrate 202. In certain embodiments, the wires (or circuitry) of the RF antenna 208 do not significantly block the light entering from the bottom side of the sapphire substrate 102 from reaching the bottom side of the PV cell 206. In other words, the position of the RF antenna 108 does not hinder the performance of the PV cell 206. By stacking all three of the RF antenna 208, the PV cell 206 and the memory 212 in a vertical direction, the footprint of the edge computing device 200 may be further reduced. Moreover, the high resistivity of the sapphire substrate 202 inhibits (or prevents) any capacitive coupling between the RF antenna 208 and the other components of the edge computing device 200 (e.g., the PV cell 206 and/or the memory 212). As shown in FIG. 2, a via 260 may be formed in the sapphire substrate 202 to allow for a conductive trace (i.e., the rightmost bond 210 in FIG. 2) to connect the memory 212 to the RF antenna 208. The high resistivity of the sapphire substrate 202 allows for this type of through-substrate electrical connection because the substrate is an insulator.

Figure 3:
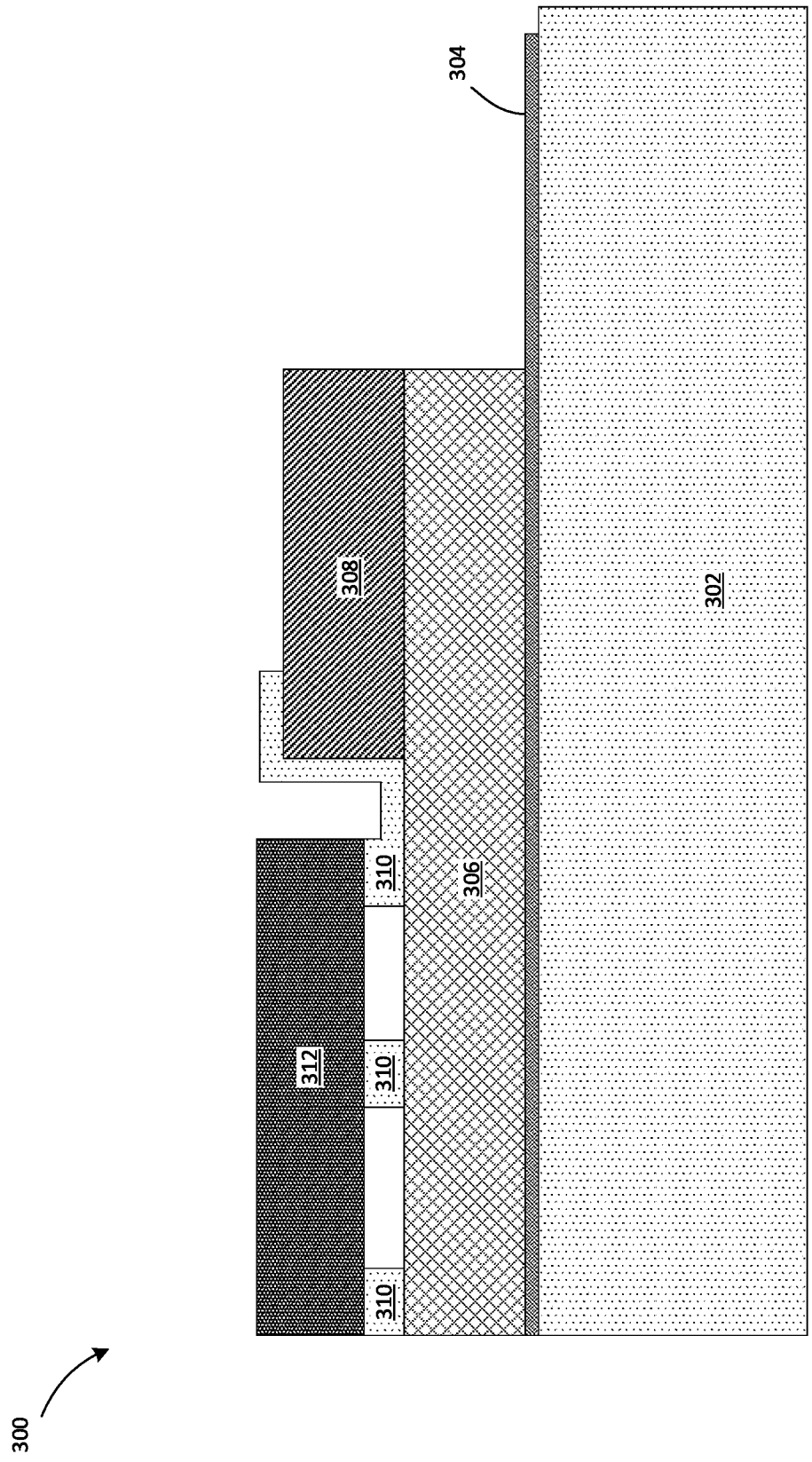
FIG. 3 is a cross-sectional view of edge computing device with a sapphire substrate, according to embodiments.

Referring now to FIG. 3, this figure shows a cross-sectional view of an edge computing device 300, according to embodiments. As shown in FIG. 3, a sapphire substrate 302 is provided, and may be similar to, or the same as, the sapphire substrate 102 described above with respect to FIG. 1. Similar to the embodiment shown in FIG. 1, a PV cell 306 is provided on the sapphire substrate 302 (with the thin layer of silicon 304 provided therebetween), and a memory 312 is provided on top of the PV cell 306. However, as shown in FIG. 3, in certain embodiments, an LED device 308 is also provided on the top side of the PV cell 306. By stacking the PV cell 306 and the memory 312 in a vertical direction and also stacking the LED device 308 and the PV cell 306 in a vertical direction, the footprint of the edge computing device 300 may be reduced. The different components of the edge computing device 300 are attached with bonds 310. Similar to the embodiments discussed above with respect to FIGS. 1 and 2, the PV cell 306 receives light from a back side (or bottom side) of the sapphire substrate 302. It should be appreciated that the LED device 308 may be any suitable LED such as GaAs, InGaAs, GaN or another suitable LED device. One effect of providing the LED device 308 on the PV cell 306 is that an extra bonding step for attaching the LED device 308 to the edge computing device 300 may be eliminated, thus reducing the total number of manufacturing steps.

Figure 4:
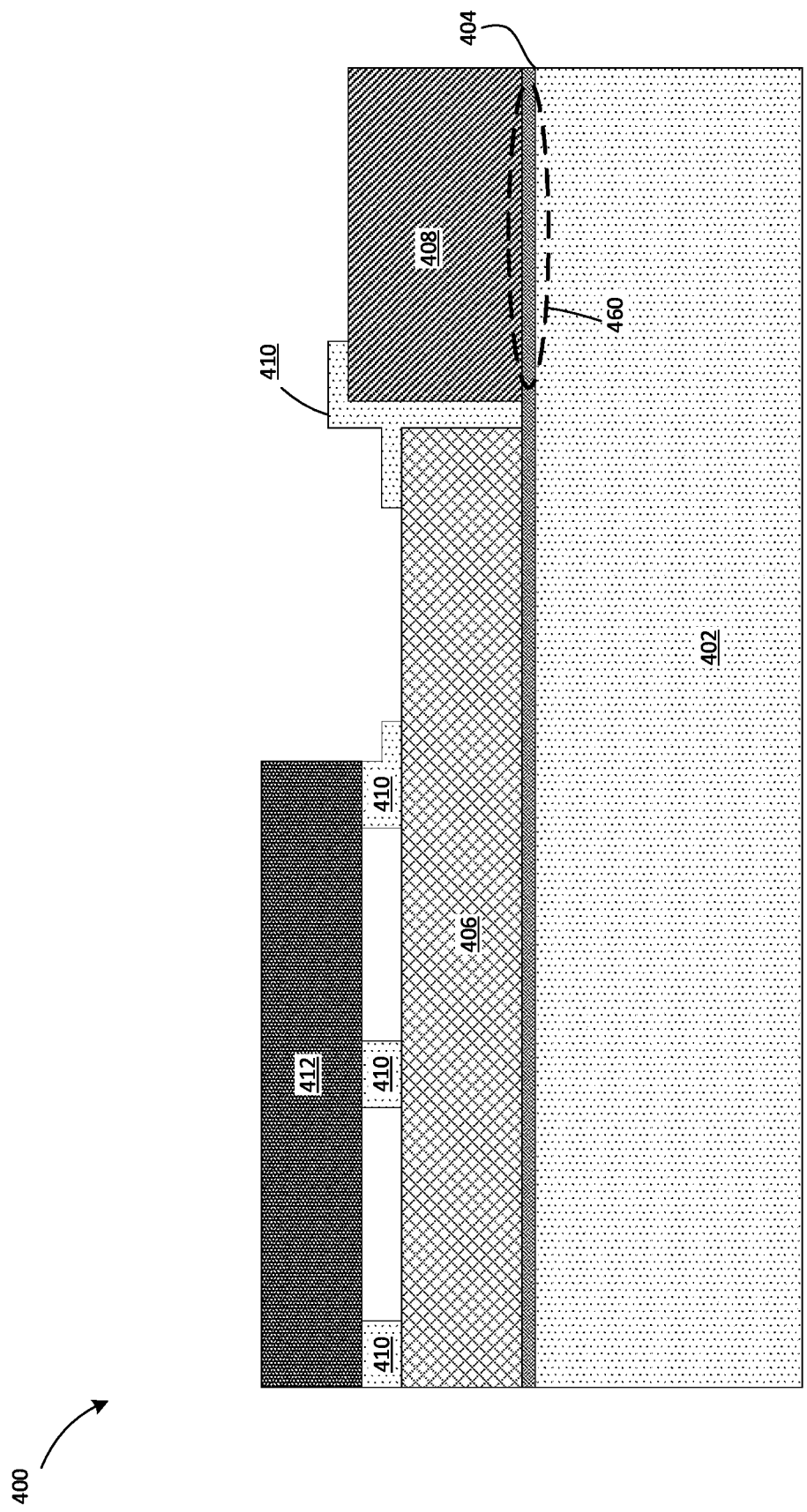
FIG. 4 is a cross-sectional view of edge computing device with a sapphire substrate, according to embodiments.

Referring now to FIG. 4, this figure shows a cross-sectional view of an edge computing device 400, according to embodiments. As shown in FIG. 4, a sapphire substrate 402 is provided, and may be similar to, or the same as, the sapphire substrate 102 described above with respect to FIG. 1. Similar to the embodiment shown in FIG. 3, a PV cell 406 is provided on the sapphire substrate 402 (with the thin layer of silicon 404 provided therebetween), and a memory 412 is provided on top of the PV cell 406. However, as shown in FIG. 4, in certain embodiments, the thin layer of silicon 404 extends beyond the right edge of the PV cell 406 to an offcut portion 460 of the thin layer of silicon 404. In these embodiments, the LED device 408 is provided on the top side of the sapphire substrate 402 on the offcut portion 460 of the thin layer of silicon 404. By stacking the PV cell 406 and the memory 412 in a vertical direction, the footprint of the edge computing device 400 may be reduced. Similar to the embodiments discussed above with respect to FIGS. 1, 2 and 3, the PV cell 406 receives light from a back side (or bottom side) of the sapphire substrate 402. It should be appreciated that the LED device 408 may be any suitable LED such as GaAs, InGaAs, GaN or another suitable LED device. The different components of the edge computing device 400 are attached with bonds 410. One effect of providing the LED device 408 on the offcut portion 460 of the thin layer of silicon 404 is that an extra bonding step for attaching the LED device 408 to the edge computing device 400 may be eliminated, thus reducing the total number of manufacturing steps.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computing device comprising:
   a sapphire substrate having a first surface and a second surface opposed to the first surface;
   a light receiving device having a first surface and a second surface opposed to the first surface, the second surface of the light receiving device coupled to the first surface of the sapphire substrate;
   a memory coupled to and at least partially overlapping the light receiving device in a vertical direction relative to the first surface of the light receiving device; and
   an antenna coupled to the first surface of the sapphire substrate.

2. The computing device of claim 1, further comprising bonds electrically connecting the light receiving device to the memory and the antenna.

3. The computing device of claim 1, wherein the antenna is a radio frequency antenna.

4. The computing device of claim 1, wherein the light receiving device is a photovoltaic device configured to generate and provide power to the memory and the antenna.

5. The computing device of claim 1, wherein the sapphire substrate is transparent.

6. The computing device of claim 1, wherein the sapphire substrate is an insulator.

7. A computing device comprising:
   a sapphire substrate having a first surface and a second surface opposed to the first surface;
   a light receiving device having a first surface and a second surface opposed to the first surface, the second surface of the light receiving device coupled to the first surface of the sapphire substrate;
   a memory coupled to and at least partially overlapping the light receiving device in a vertical direction relative to the first surface of the light receiving device; and
   an antenna coupled to the second surface of the sapphire substrate.

8. The computing device of claim 7, further comprising bonds electrically connecting the light receiving device to the memory, and the connecting the light receiving device to the antenna through the sapphire substrate.

9. The computing device of claim 7, wherein the antenna is a radio frequency antenna.

10. The computing device of claim 7, wherein the light receiving device is a photovoltaic cell configured to generate and provide power to the memory and the antenna.

11. The computing device of claim 7, wherein the light receiving device, the antenna and the memory are stacked in a direction perpendicular to a surface of the sapphire substrate.

12. The computing device of claim 7, further comprising a processor coupled to the light receiving device.

13. The computing device of claim 7, further comprising a silicon layer between the sapphire substrate and the light receiving device.

14. A computing device comprising:
   a sapphire substrate having a first surface and a second surface opposed to the first surface;
   a light receiving device having a first surface and a second surface opposed to the first surface, the second surface of the light receiving device coupled to the first surface of the sapphire substrate;
   a memory coupled to and at least partially overlapping the light receiving device in a vertical direction relative to the first surface of the light receiving device; and
   a light-emitting device connected to the light receiving device.

15. The computing device of claim 14, wherein the light emitting device is provided on the first surface of the sapphire substrate.

16. The computing device of claim 14, wherein the light emitting device is provided on the first surface of the light receiving device.

17. The computing device of claim 14, further comprising bonds electrically connecting the light receiving device to the memory and the light-emitting device.

18. The computing device of claim 14, wherein the light emitting device includes a material selected from the group consisting of GaN, GaAs and InGaAs.

19. The computing device of claim 14, wherein the light receiving device is a photovoltaic cell configured to generate and provide power to the memory and the light-emitting device.

20. The computing device of claim 14, further comprising a silicon layer formed directly on the sapphire substrate, wherein the light receiving device and the light-emitting device are provided on different areas of the silicon layer, and wherein the light receiving device and the memory are stacked in a direction perpendicular to a surface of the sapphire substrate.

* * * * *